(12) United States Patent
Maone et al.

(10) Patent No.: US 8,319,756 B2
(45) Date of Patent: Nov. 27, 2012

(54) ADAPTIVE HYSTERESIS FOR REDUCED SWING SIGNALLING CIRCUITS

(75) Inventors: Francesco Alex Maone, Zürich (CH); Antonius Petrus Welbers, Malters (CH)

(73) Assignee: Entropic Communications, Inc., San Diego, CA (US)

( * ) Notice: Subject to any disclaimer, the term of this patent is extended or adjusted under 35 U.S.C. 154(b) by 1760 days.

(21) Appl. No.: 10/534,890

(22) PCT Filed: Oct. 28, 2003

(86) PCT No.: PCT/IB03/04781
§ 371 (c)(1),
(2), (4) Date: May 12, 2005

(87) PCT Pub. No.: WO2004/047292
PCT Pub. Date: Jun. 3, 2004

(65) Prior Publication Data
US 2006/0164404 A1    Jul. 27, 2006

(30) Foreign Application Priority Data
Nov. 15, 2002 (EP) ..................... 02102595

(51) Int. Cl.
*G06F 3/038* (2006.01)

(52) U.S. Cl. ....................... 345/204; 345/208

(58) Field of Classification Search .......... 345/211–213, 345/204, 208; 455/234.1; 359/260
See application file for complete search history.

(56) References Cited

U.S. PATENT DOCUMENTS

| 4,535,294 | A | * | 8/1985 | Ericksen et al. ............... 327/58 |
| 4,989,242 | A | * | 1/1991 | Arnaud .................... 379/390.01 |
| 4,994,692 | A |   | 2/1991 | Wolke |
| 5,852,637 | A |   | 12/1998 | Brown et al. |
| 6,111,431 | A | * | 8/2000 | Estrada ........................... 326/83 |
| 6,185,422 | B1 |  | 2/2001 | Mattila |
| 6,281,731 | B1 | * | 8/2001 | Fifield et al. .................. 327/205 |
| 6,356,260 | B1 |  | 3/2002 | Montalbo |
| 6,516,185 | B1 | * | 2/2003 | MacNally ................. 455/234.1 |
| 6,597,352 | B1 | * | 7/2003 | Haapakoski et al. ......... 345/211 |
| 6,836,149 | B2 | * | 12/2004 | Chow ............................. 326/83 |

FOREIGN PATENT DOCUMENTS

| DE | 4416 908 A1 | 11/1995 |
| EP | 0 939 300 | 1/1999 |
| JP | 2004-552938 | 8/1920 |
| JP | 59221026 (A) | 12/1984 |
| JP | 02-151118 | 6/1990 |
| JP | 06-177718 | 6/1994 |
| JP | 11-506290 | 6/1999 |
| WO | WO 00/45507 | 8/2000 |

* cited by examiner

*Primary Examiner* — Quan-Zhen Wang
*Assistant Examiner* — Calvin C Ma

(57) ABSTRACT

Apparatus (50) for processing a differential input signal. The apparatus (50) comprises a minimum peak detector (51) with a differential input (28). The peak detector (51) provides a first voltage being proportional to an average voltage peak at the peak detector's differential input (28). A compressor (53) is provided for processing the first voltage in order to provide a second voltage. The compressor (53) is followed by a voltage controllable current source providing a trim current that is adjustable by the second voltage. A hysteresis equipped circuit (67.1) whose hysteresis characteristics are adjustable by the trim current is part of the apparatus (50).

17 Claims, 3 Drawing Sheets

ADAPTIVE HYSTERESIS FOR REDUCED SWING SIGNALLING CIRCUITS

The present invention concerns systems with adaptive hysteresis. More particularly, this invention relates to interface circuits with adaptive hysteresis as used in display systems, for example.

The actual market trend requires very often high speed, low power systems. For this reason, several new protocols have been studied and implemented in order to be able to satisfy these requirements.

The main criteria that are of particular importance for display systems are:
- reduced bus width in order to enable smaller and thinner column driver boards;
- low power dissipation in order to extend the run time of a display system;
- low electromagnetic interference (EMI) generation which allows to eliminate EMI suppression components and the conventional shielding;
- high throughput allowing high resolution displays to be realized.

One protocol among the most widely used ones is the so-called RSDS™ (reduced swing differential signaling) standard. RSDS is a trademark of National Semiconductor Corporation. The RSDS protocol satisfies the above criteria.

In particular the tendency of the TFT-display industry toward higher resolution displays requires a new low noise digital interface such as an RSDS-based interface. In a liquid crystal flat panel display (LCD), digital data supplied by a host computer are converted into analog voltages which drive a display to produce the desired grayscale or color images. Column drivers are important elements for driving such displays.

RSDS is a signaling standard that defines the output characteristics of a transmitter and inputs of a receiver along with the protocol for a chip-to-chip interface between display (e.g., flat panel display) timing controllers and the column drivers employed for driving the column electrodes of the display panel.

Display systems being based on the RSDS protocol have a differential interface with a nominal signal swing of 200 mV. This interface retains the main benefits of known robust digital LVDS interfaces that are commonly used between the host computer (e.g., a graphics processor) and the LCD panel of a high-bandwidth display system. LVDS is short for "Low Voltage Differential Signaling" and is a high speed, low power data transmission standard. Noting that the RSDS is employed in a sub-system of a display, the signal swing can be further reduced from LVDS to even lower swings.

FIG. 1 shows a typical block diagram of an LCD system. LVDS is used as the interface between a host computer (not illustrated in FIG. 1) and a panel module 10. An LVDS receiver function 11 is typically integrated into a panel timing controller 12. An RSDS bus 13 is located between the panel timing controller 12 (TCON) serving as transmitting circuit and a column driver bank 14 serving as receiving circuit. The RSDS bus 13 is typically a differential bus that is eight pair wide plus a clock pair and it may have a multidrop bus configuration. The column driver bank 14 comprises a plurality of RSDS column drivers 14.1. Typically, each column driver 14.1 of the column driver bank 14 serves n column electrodes (with n=384 or 480, for example) of the display panel 16 by providing analog output signals. In the present example, each column driver 14.1 serves n=4 column electrodes only. There is a row driver array 15 comprising an array of row drivers 15.1. Several of the rows of the panel 16 are driven by any of these row drivers 15.1. The row drivers 15.1 are activated sequentially to turn on one row of pixels at a time, allowing analog voltages driven onto the columns to be applied to each row of pixels in series. The panel 16 may be a TFT-LCD panel with 640 pixels width and 480 lines (or rows) of pixels, for example. The column drivers 14.1 have interfaces using a differential clock signal (CLK+ and CLK−) received via the RSDS bus 13 to strobe the video data. Further details concerning the RSDS signaling standard are given in the National Semiconductor Corp. RSDS Specification, Revision 0.95, May 2001, for example. Additional details can be taken from the U.S. Pat. No. 6,356,260, currently being assigned to National Semiconductor Corp.

Unfortunately, due to noise, the window in which the RSDS signaling scheme works properly is susceptible to degradation. In a conventional display system, a hysteresis equipped circuit is introduced in the column driver interface in order to be able to limit the effects of the noise. This hysteresis equipped circuit is typically hard-wired. It is another problem, that in certain circuits the signal levels of the differential clock signals (e.g., the CLK+, CLK− signals and the video data signals D0+, D0−, D1+, and so forth) vary. Under certain circumstances this leads to an unpredictable behavior of the RSDS circuitry, since the input signals may either be too small or too large to properly trigger the hysteresis equipped circuit. Current systems cannot be dynamically adapted to actual working conditions.

In the U.S. Pat. No. 4,535,294 a system is described, where the potential at a comparator circuit is shifted in order to ensure that the input signal lies within the right window. According to this US-patent, the thresholds are hard-wired and can thus not be changed. Due to this it is necessary to shift the potential at the input side. By doing so, it is ensured that a symmetrical signal is applied to the comparator's input.

It is thus an objective of the present invention to improve interfaces processing differential input signals of varying signal level. It is a further objective to improve conventional RSDS circuits and display systems based thereon.

According to the present invention, an interface circuit that can be adapted to actual working conditions, is provided. It is thus possible to reduce or eliminate problems caused by noise and/or variations in the level of a differential input signal.

These disadvantages of known systems, as described above, are reduced or removed with the invention as described and claimed herein.

An apparatus for processing a differential input signal in accordance with the present invention is claimed in claim 1.

Various advantageous embodiments are claimed in claims 2 through 10.

A control circuitry for a display system in accordance with the present invention is claimed in claim 11.

Various advantageous methods are claimed in claims 12 through 17.

Advantages of the present invention are addressed in connection with the detailed embodiments.

For a more complete description of the present invention and for further objects and advantages thereof, reference is made to the following description, taken in conjunction with the accompanying drawings, in which.

Figure 1:
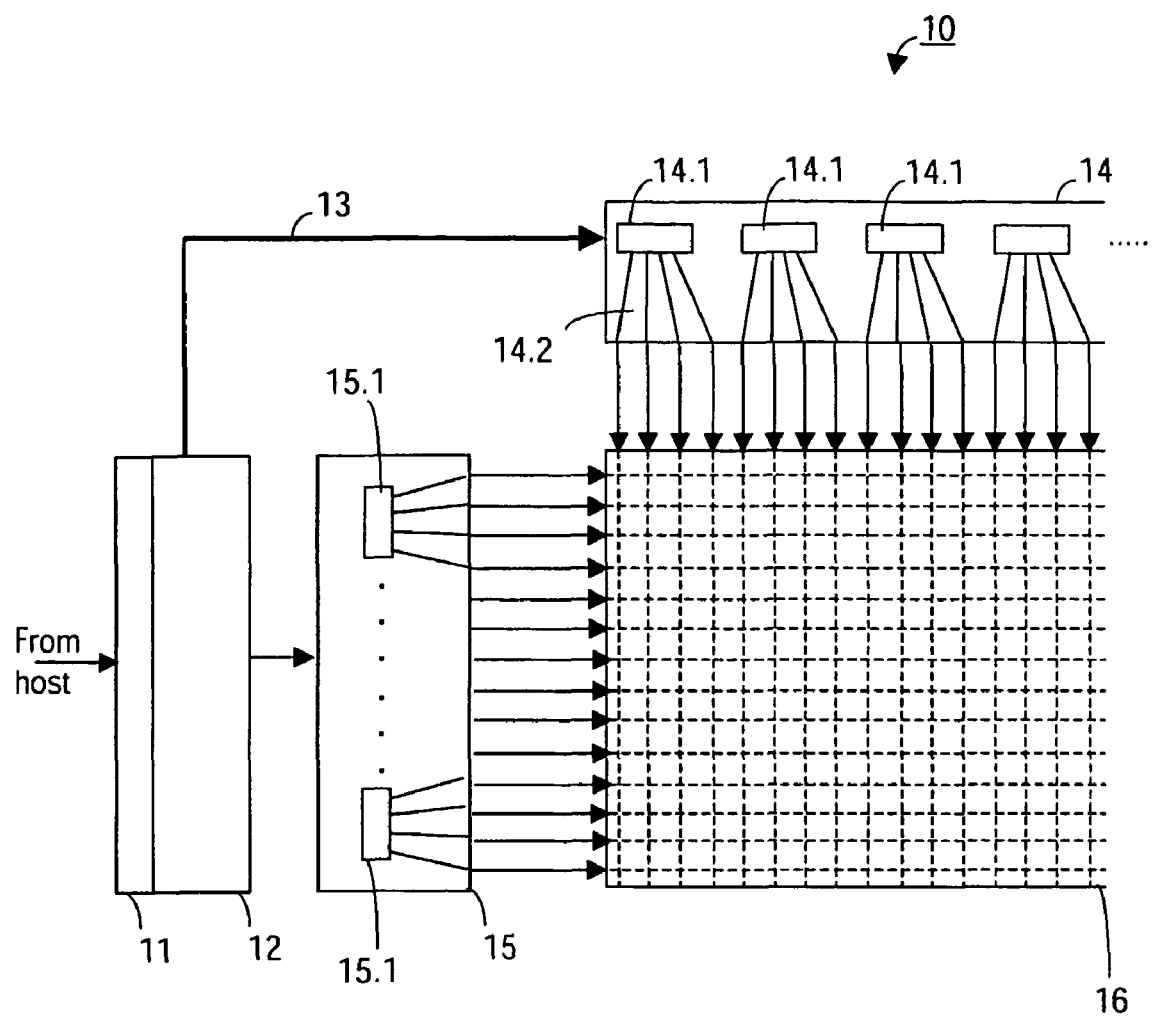
FIG. 1 is a block diagram of a conventional LCD display.
Figure 2A:
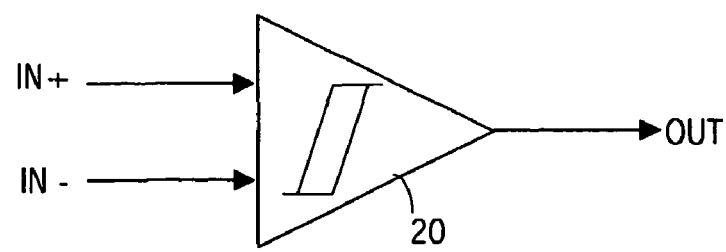
FIG. 2A is a diagram depicting a hysteresis equipped circuit with a differential input.
Figure 2B:
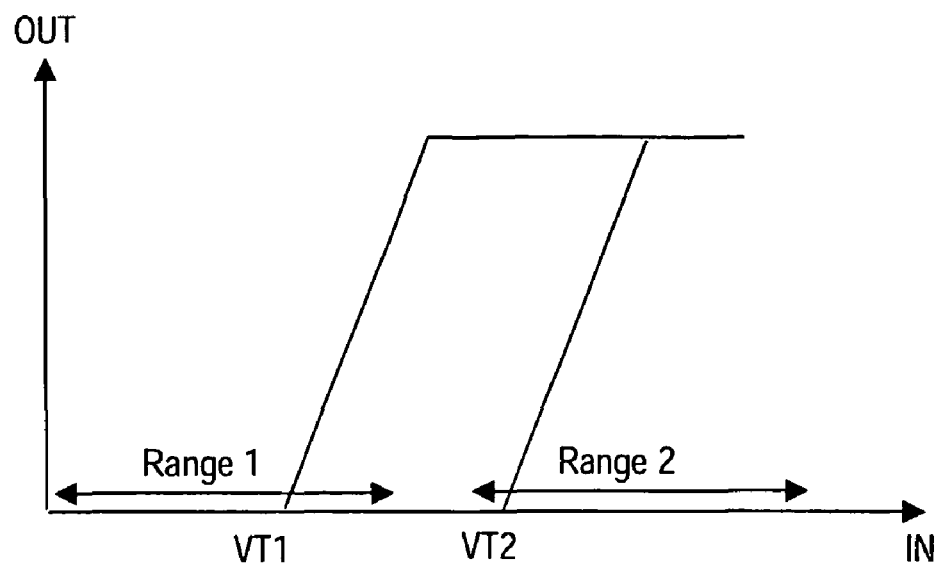
FIG. 2B is a diagram used to illustrate that low level input signals and high level input signals will not allow a hysteresis equipped circuit such as a Schmitt-trigger to trigger properly.

Before addressing details of the invention, a few aspects of a hysteresis equipped circuit are described in connection with FIGS. 2A and 2B. A block diagram of a simple hysteresis equipped circuit 20 is given in FIG. 2A. When the differential input signal IN+, IN− is effected by noise, the benefit due to the hysteresis is that the glitches of the input signal are filtered resulting in a sharpened output waveform OUT without spurious transitions. This is the typical behavior of a Schmitt-trigger. Unfortunately, a hysteresis equipped circuit 20 has VT1 and VT2 thresholds (also known as trip-levels) being fixed by design, as illustrated in FIG. 2B. If the level and/or the reciprocal amplitude of the input signal IN+, IN− changes, the built-in and fixed hysteresis could even make the whole circuit useless. In FIG. 2B two situations are shown where the hysteresis equipped circuit would not operate properly. Assuming that the input signal level of IN+, IN− is in the Range 1, the upper trip-level VT2 will never be reached. If the input signal level of IN+, IN− is in the Range 2, the input signal will not drop below the lower trip-level VT1. In both cases the circuit 20 will not able to provide the desired output waveform OUT.

According to the present invention, the level of the input signal is sensed and the hysteresis is adapted accordingly.

In one embodiment, a synchronous application is given where a differential clock signal is used to perform the sensing phase.

Figure 3:
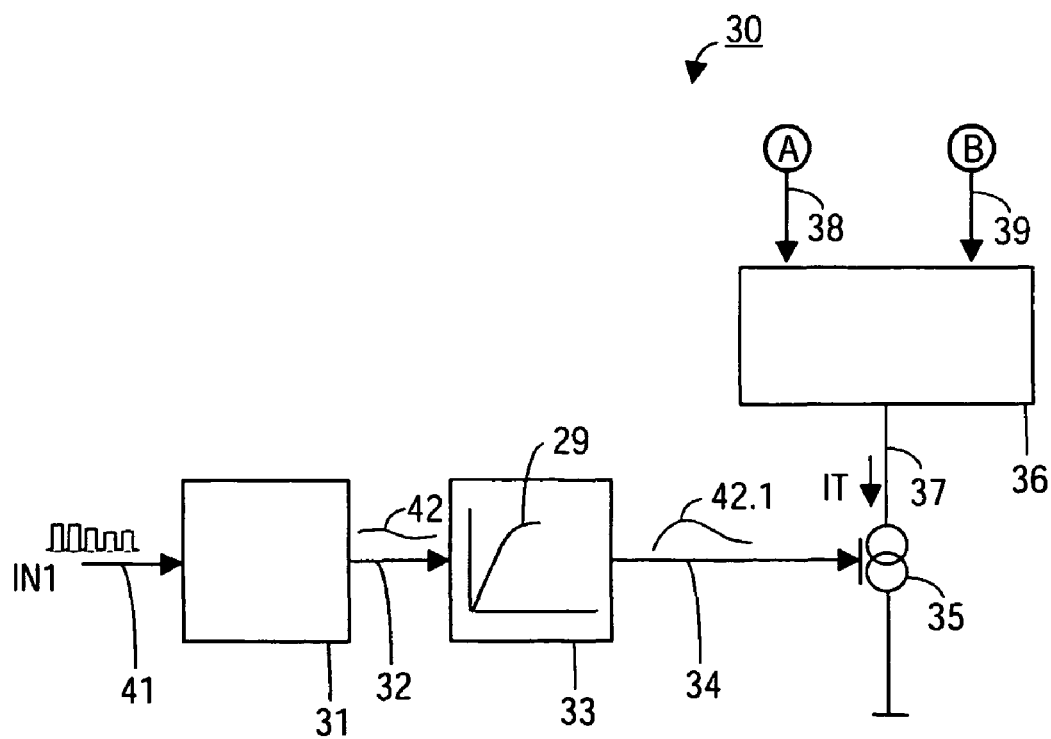
FIG. 3 is a block diagram of a first embodiment in accordance with the present invention.

The working principle of the invention is now described in connection with FIG. 3. An apparatus 30 for processing an input signal IN1 is provided, whereby for sake of simplicity only one input signal IN1 is involved. According to the present embodiment, the apparatus 30 comprises a maximum peak detector 31 providing a first voltage 42 at an output 32. This first voltage is proportional to the average voltage peak of the input signal IN1 applied to the peak detector's input 41. The signal 42 is a low frequency signal. A compressor 33 follows after the peak detector 31. It processes the first voltage 42 in order to provide a second voltage 42.1 at an output line 34. The compressor may implement a function 29 (function g) that amplifies small voltages and that compresses large voltages at the input 32. The second voltage is applied to a voltage controllable current source 35 providing a trim current IT being adjustable by the second voltage. A hysteresis equipped circuit 36 is provided whose hysteresis characteristics are adjustable by the trim current IT. The hysteresis equipped circuit 36 has input/output terminals 38, 39 designated as A and B. These terminals A and B are the nodes where the hysteresis is effective.

When the input level at the input 41 changes, the peak detector 31 starts to follow the new average peak and provides a voltage level (referred to as first voltage 42) that is proportional to the average peak at the input 41. This first voltage 42 is handled by the compressor 33 and then used to adjust the trim current IT provided by the voltage controllable current source 35. This trim current IT is used to trim the hysteresis characteristics of the hysteresis equipped circuit 36. For each input level at the input side 41, the peak detector 31 provides a voltage (first voltage 42) representing the amplitude (average) of the input IN. The compressor 33 provides and applies the second voltage 42.1 to the current source 35 to control/tune the hysteresis needed for the actual input level. This arrangement allows to adjust the working range and ensures that the hysteresis characteristics of the hysteresis equipped circuit 36 is trimmed so that the circuit 36 allows a proper triggering when processing the signals being applied between the two terminals A and B.

The maximum peak detector 31 may comprise an integrator, for example.

Figure 4:
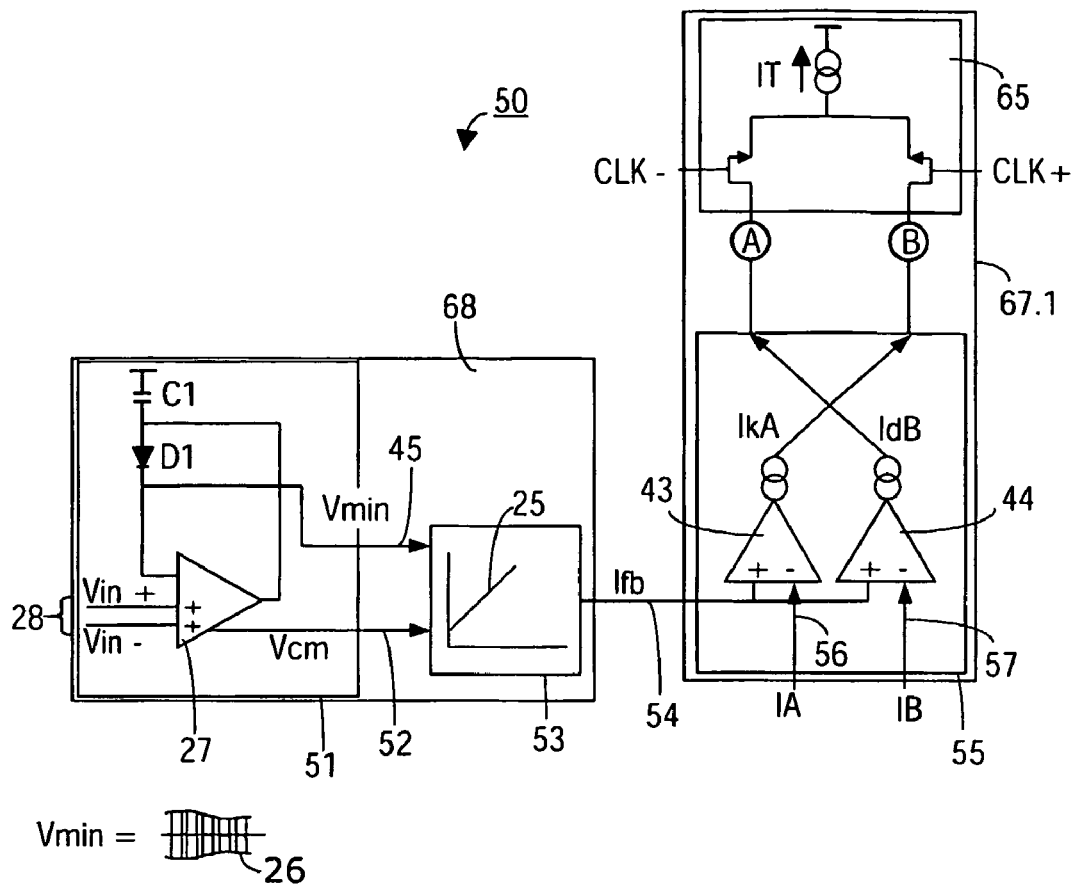
FIG. 4 is a block diagram of a second embodiment in accordance with the present invention.

According to one embodiment of the present invention, an intentional unbalancing of the two branches of a differential pair 65 (terminals A and B) of a comparator by means of two extra currents (IkA and IdB) is used, as shown in FIG. 4. These extra currents IkA and IdB depend on the amplitude of the differential input signal IN at the differential input 28. When the currents on these two branches (terminals A and B) are affected by a mismatch (due to the intentional unbalancing), this results in an input offset of the comparator 65. Thanks to this input offset, the differential input pair 65 of the comparator will be insensible to signals whose differential amplitude is smaller or equal to the input offset. In other words, the input offset implies a hysteresis. If the signum of the input offset is controlled by a circuit which in accordance with the present invention switches depending on the state of the differential input IN (e.g., a hysteresis equipped circuit such as a Schmitt-trigger), the hysteresis can be made to be symmetrical. This leads to an improvement of the overall performance.

A detailed implementation of an embodiment of the invention is depicted in FIG. 4. FIG. 4 shows an apparatus 50. The apparatus 50 comprises a block 68 with a peak detector being realized as a minimum envelop extractor 51. This minimum envelop extractor 51 follows the envelop signal 26 (designated by Vmin) of the differential input signal ($V_{in+}$ and $V_{in-}$) that is applied to the differential input 28. The minimum envelop extractor 51 has two output lines 52 and 45. It provides the envelop signal Vmin 26 at the output 45 and a common mode voltage Vcm at output 52. Vmin and Vcm are defined as follows: Vmin=($V_{in+}-V_{in-}$); Vcm=($V_{in+}+V_{in-}$)/2. The voltages Vmin and Vcm are both fed to a compressor 53. This compressor 53 in the present embodiment carries out a current function g (as indicated by the curve 25 inside the box 53) of these two voltages Vmin and Vcm, i.e., g=f (Vmin, Vcm). The compressor 53 transforms the two voltages Vmin and Vcm into a trim current Ifb being defined as follows: Ifb=g*(Vcm−Vmin). Note that in principle this function g could be of any kind. In the present embodiment, the function g is realized by a transconductance which relates the difference ΔV between the voltages Vmin and Vcm (with ΔV=Vcm−Vmin) at the input side of the compressor 53 and a feedback current Ifb at the output 54. This feedback current Ifb is an image of the amplitude of the differential input signal (Vin+ and Vin−) and is used to control the amount of hysteresis to be introduced. The apparatus 50 further comprises a block 67.1 with a hysteresis equipped circuit 55 having two current differential amplifiers 43, 44, and at least the differential input pair 65 of a comparator. By means of the two current differential amplifiers 43, 44, the currents IkA and IdB are processed, whereby IkA=K(Ifb−IA) and IdB=D(Ifb−IB). As depicted in FIG. 4, the current IA is the initial current in the branch 56 and 113 is the initial current in the branch 57. The terminals A and B are the nodes where the hysteresis is effective.

The hysteresis equipped circuit 55 may operate as follows. It is supposed that the initial current IA>IB. It is now the aim to decrease the current IB in the way that at a next transition of the differential signal between the nodes A and B a commutation is triggered at a higher value of the input CLK+. For this purpose, the current IkA is spilled from the node B. Due to the cross connection inside the hysteresis equipped circuit 55, this initiates a positive feedback which increases the current in A and decreases the current in B. As a side effect, the propagation delay of the comparator 65 is improved.

The hysteresis equipped circuit 55 may drive the currents IA and I3 through loads of the differential input pair 65 of the comparator, for instance.

Figure 5:
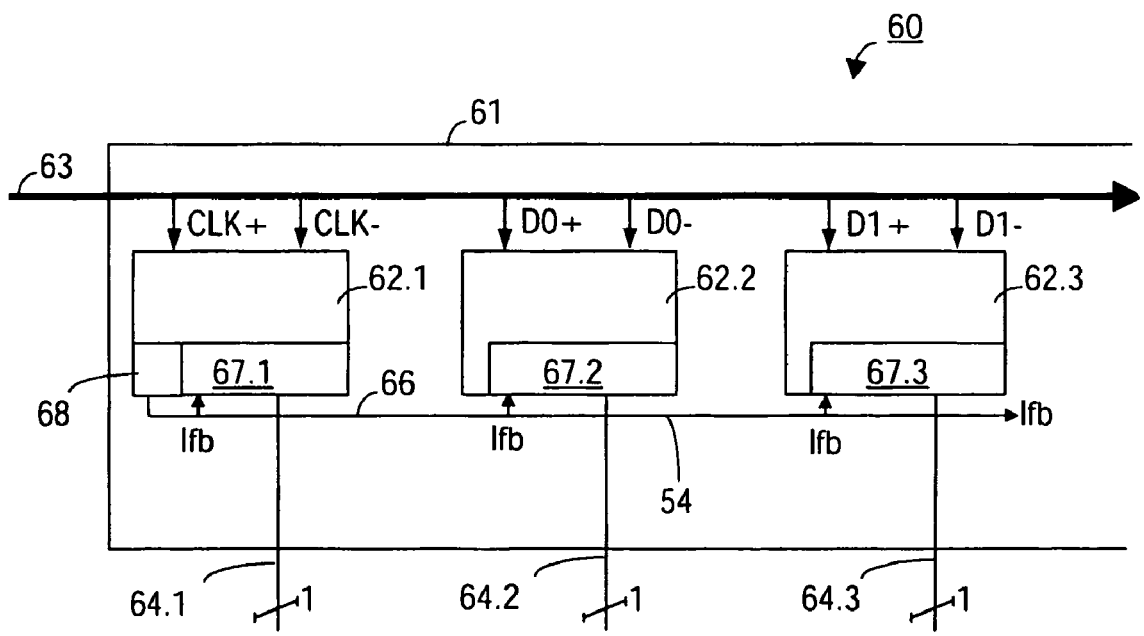
FIG. 5 is a block diagram of a system comprising the embodiment illustrated in FIG. 4.

A system implementation of the embodiment of FIG. 4 is depicted in FIG. 5. In this Figure part of a control circuit 60 of a display system is depicted. The control circuit 60 comprises an interface bank 61 with a plurality of interfaces. Three interfaces 62.1, 62.2, and 62.3 are shown in FIG. 5. There is a data bus 63, e.g. an RSDS bus, that carries differential video data signals (D0+, D0−, D1+, D1−, . . . ) and a differential clock signal (CLK+, CLK−). The differential clock signal may be the so-called video clock signal of the display system. It is this data bus 63 that dissipates power and also generates electromagnetic interference (EMI). The power dissipation is high because most existing display systems use TTL voltage levels (3.3 Volts CMOS levels) to transmit the pixel data via the data bus 63. The high data rates on this data bus 63 and the sharp transition edges of the differential signals generate significant EMI. The first interface 62.1 of the interface bank 61 comprises a circuit block 68 according to FIG. 4.

According to the present invention, the differential clock signal determines the trip level of a hysteresis equipped circuit 67.1 of the first interface 62.1, as well as the trip levels of the hysteresis equipped circuits 67.2, 67.3, etc. of all the subsequent interfaces 62.2, 62.3, and so forth. For this purpose, the output signal Ifb of the circuit 68 is fed to the hysteresis equipped circuit 67.1 that is part of the first interface 62.1. The very same signal Ifb is also fed via the connection line 54 to the hysteresis equipped circuits 67.2, 67.3 of the subsequent interfaces 62.2, 62.3. This approach allows all the hysteresis equipped circuits (e.g., comparators 65) of all these interfaces to be adjusted according to the current level of the clock differential input signals (CLK+, CLK−). That is, the trip-level of the hysteresis equipped circuits are shifted as the clock differential input signal (CLK+, CLK−) on the bus 63 changes.

Note that in addition to the elements shown in FIG. 5, the control circuit 60 typically comprises additional circuits, such as shift registers, digital-to-analog converter (DAC) latches, and so forth.

The inventive scheme always works with two signal, i.e., with the difference between these two signals. The embodiments presented herein are fast and are thus well suited for use in RSDS-based systems.

According to the invention, timing is not a critical issue, since after a system start, the clock signal reaches its final peak-to-peak amplitude of the differential input signal IN and then usually keeps it more or less constant.

According to the invention, the trip-levels of the comparators are shifted to lower levels as the differential input signal gets smaller and to higher levels as the differential input signal gets larger.

The inventive circuitry is well suited for use in RSDS interfaces for display applications with resolutions between VGA and UXGA.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

The invention claimed is:

1. Apparatus for processing a differential clock signal, the apparatus comprising
   a peak detector with a differential input, the peak detector configured to provide a first voltage being proportional to an average voltage peak at the peak detector's differential input,
   a compressor configured to process the first voltage in order to provide a second voltage,
   a voltage controllable current source configured to provide a trim current being adjustable by the second voltage,
   a hysteresis equipped circuit having hysteresis characteristics, the hysteresis equipped circuit configured to adjust the hysteresis circuit responsive to the trim current,
   wherein the peak detector is operationally coupled to the compressor and the compressor is operationally coupled to the voltage controllable current source.

2. The apparatus of claim 1, wherein the peak detector comprises an integrator.

3. The apparatus of claim 1, wherein the peak detector operates on the envelop of a differential input signal being applied to the differential input.

4. The apparatus of claim 1, wherein the peak detector is designed to constantly follow the average voltage peak at the peak detector's differential input.

5. The apparatus of claim 1, providing a hysteresis characteristics depending on the average voltage peak at the peak detector's differential input.

6. The apparatus of claim 1, wherein the peak detector comprises a differential input transistor pair at its differential input.

7. The apparatus of claim 6, wherein the load conditions of the differential input transistor pair changes when the average voltage peak changes.

8. The apparatus of claim 1, wherein the hysteresis characteristics are adjusted by shifting trip-levels of the hysteresis equipped circuit to lower levels if the differential input signal is a low level signal and to higher levels if the differential input signal is a high level signal.

9. The apparatus of claim 1, wherein a differential clock signal is used as the differential input signal to perform a sensing phase and an appropriate adjustment of the hysteresis characteristics.

10. The apparatus of claim 1, wherein the compressor applies a function when processing the first voltage (42) in order to provide the second voltage.

11. Control circuitry for a display system comprising an array of interfaces, whereby at least one interface comprises
    a peak detector with a differential input, the peak detector configured to provide a first voltage being proportional to an average voltage peak of a differential clock signal being applied to the peak detector's differential input,
    a compressor configured to process the first voltage in order to provide a second voltage,
    a voltage controllable current source configured to provide a current being adjustable by the second voltage,
    a hysteresis equipped circuit having hysteresis characteristics, the hysteresis equipped circuit configured to adjust the hysteresis circuit responsive to the current.

12. The control circuitry of claim 11, wherein a signal is provided by the at least one interface (62.1) to other interfaces of the array of interfaces in order to allow the hysteresis characteristics of the other interfaces to be adjusted, too.

13. The control circuitry of claim 11, wherein the interfaces of the array of interfaces serve as differential RSDS interfaces.

14. The control circuitry of claim 11, wherein the interfaces of the array of interfaces serve as low EMI/low power interfaces between timing controllers and digital-to-analog latches employed for driving analog signals onto column electrodes of a display panel of the display system.

15. The control circuitry of claim 14, wherein any kind of reduced swing signaling can be used to transmit the video data to the array of interfaces.

16. The control circuitry of claim 11 further comprising a transmitting circuit for transmitting video data to the array of interfaces.

17. The control circuitry of claim 16, wherein the array of interfaces converts the video data into analog signals for driving onto column electrodes of a display panel of the display system.

* * * * *